(12) United States Patent
Rumer et al.

(10) Patent No.: US 7,304,381 B2
(45) Date of Patent: Dec. 4, 2007

(54) PACKAGE AND METHOD FOR ATTACHING AN INTEGRATED HEAT SPREADER

(75) Inventors: Christopher L. Rumer, Chandler, AZ (US); Sabina J. Houle, Phoenix, AZ (US); Oswald L. Skeete, Phoenix, AZ (US); Mike T. Reiter, Gilbert, AZ (US); Jeff R. Wienrich, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/461,803

(22) Filed: Aug. 2, 2006

(65) Prior Publication Data

US 2006/0267182 A1      Nov. 30, 2006

Related U.S. Application Data

(62) Division of application No. 10/446,595, filed on May 28, 2003, now abandoned.

(51) Int. Cl.
*H01L 23/34* (2006.01)

(52) U.S. Cl. .............. 257/717; 257/713; 257/257; 257/E23.083; 257/E23.084

(58) Field of Classification Search ............... 257/706, 257/712, 713, 717, 718
See application file for complete search history.

(56) References Cited

U.S. PATENT DOCUMENTS

| 4,321,423 | A | | 3/1982 | Johnson et al. |
| 4,546,408 | A | | 10/1985 | Rodseth et al. |
| 5,926,371 | A | | 7/1999 | Dolbear |
| 5,949,137 | A | * | 9/1999 | Domadia et al. ............ 257/712 |
| 5,963,428 | A | * | 10/1999 | Salmonson et al. ......... 361/704 |
| 6,212,074 | B1 | * | 4/2001 | Gonsalves et al. .......... 361/717 |
| 6,297,961 | B1 | | 10/2001 | Koizumi et al. |
| 6,483,185 | B1 | * | 11/2002 | Nagase et al. .............. 257/706 |
| 6,750,551 | B1 | * | 6/2004 | Frutschy et al. ............ 257/785 |
| 6,756,669 | B2 | | 6/2004 | Houle |
| 6,853,068 | B1 | | 2/2005 | Djekic |
| 6,870,258 | B1 | * | 3/2005 | Too ........................... 257/704 |
| 6,963,130 | B1 | * | 11/2005 | Djekic ....................... 257/706 |
| 7,019,976 | B1 | * | 3/2006 | Ahmad et al. .............. 361/704 |
| 7,032,305 | B2 | * | 4/2006 | Petit et al. .................... 29/832 |
| 7,042,727 | B2 | * | 5/2006 | Ulen et al. .................. 361/704 |
| 7,113,406 | B1 | * | 9/2006 | Nguyen et al. ............. 361/719 |
| 7,170,165 | B2 | * | 1/2007 | Berto et al. ................. 257/718 |
| 2004/0238947 | A1 | | 12/2004 | Rumer et al. |

OTHER PUBLICATIONS

In: *The American Heritage Dictionary of the English Language, Fourth Edition*, Definition of Word "rivet", print out from dictionary.com,(2000).

* cited by examiner

*Primary Examiner*—David A. Zarneke
(74) *Attorney, Agent, or Firm*—Schwegman, Lundberg & Woessner, P.A.

(57) ABSTRACT

In some embodiments, an integrated circuit package includes a substrate and a heat spreader coupled to the substrate by fasteners. Thermal interface material thermally couples the die to the heat spreader. The heat spreader is provided over the die and is attached to the substrate with fasteners rather than a sealant-adhesive. Some examples of suitable fasteners may include rivets, barbed connectors, and gripping clips.

25 Claims, 8 Drawing Sheets

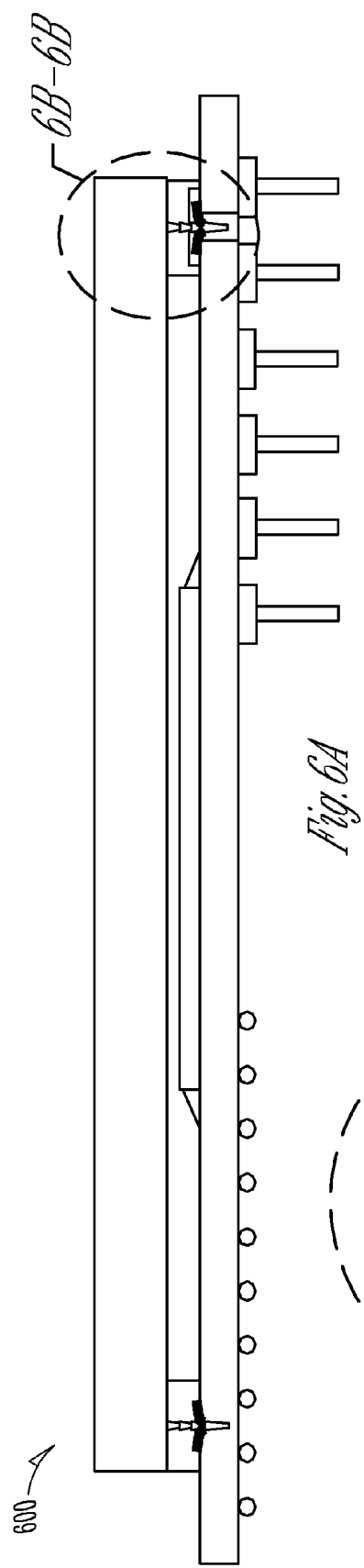
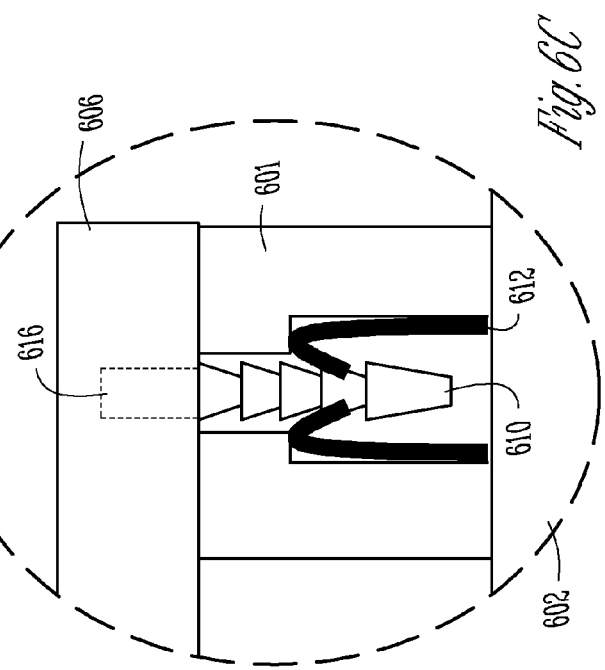
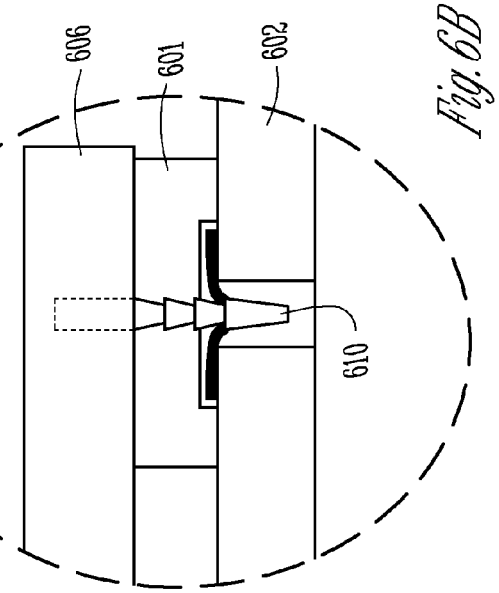
Fig. 6A
Fig. 6B
Fig. 6C

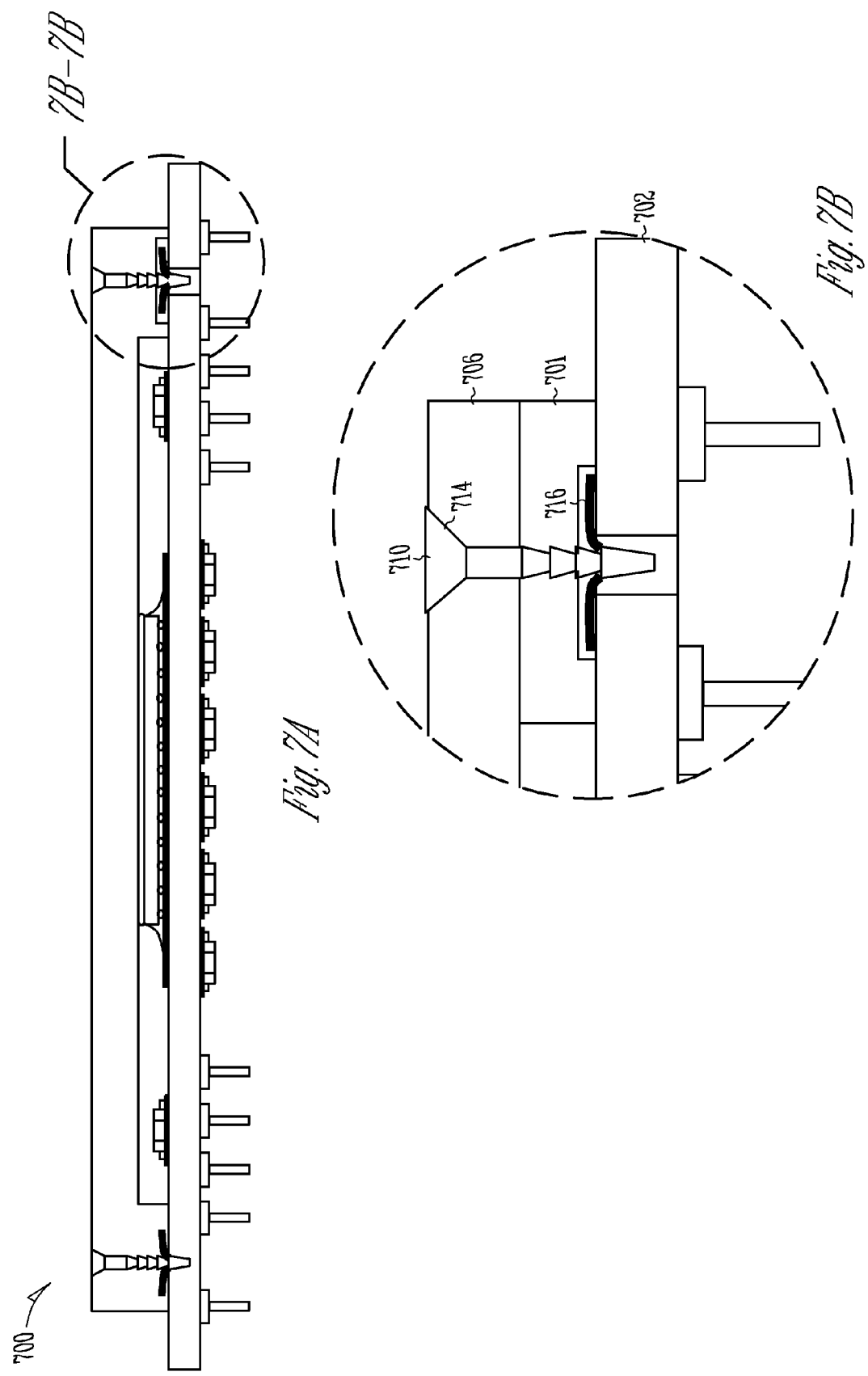

US 7,304,381 B2

PACKAGE AND METHOD FOR ATTACHING AN INTEGRATED HEAT SPREADER

This application is a divisional of U.S. patent application Ser. No. 10/446,595, filed on May 28, 2003 now abandoned, which is incorporated herein by reference.

TECHNICAL FIELD

Embodiments of the present invention pertain to integrated circuit package manufacturing, and in some embodiments, to techniques to retain heat spreader lids over a die on a substrate.

BACKGROUND

Manufacture of integrated circuit packages may involve, among other things, the installation of heat spreaders onto the package. During an installation process, a heat spreader lid may be adhered to a substrate while the package is mounted in a process carrier. The lid is conventionally affixed to the substrate using an adhesive or a sealant. A thermal interface material may be applied between the die and the heat spreader. Thermal conductivity between the heat spreader and the die may be dependent on the application force on the lid during curing of the thermal interface material. A clip is typically used to secure the package in the process carrier and apply force to the heat spreader while the sealant-adhesive and interface material are cured. To ensure proper heat transfer from the substrate to the heat spreader, the force asserted by the clip should be maintained within an appropriate range. The use of clips and sealant-adhesive to adhere the heat spreader to the substrate presents many manufacturing and process challenges.

One challenge is that the sealant-adhesive used to secure the heat spreader to the substrate may require additional curing steps in addition to the curing of the thermal interface material. Another problem is that the sealant-adhesive sometimes delaminates the surface of the substrate, especially in highly stressed packages. Another problem is that the insertion and removal of clips requires additional handling and assembly steps increasing cost and reducing repeatability. Another problem is that the clips may change their spring/retention force over time and temperature affecting the thermal interface between the die and the heat spreader.

Thus, what is needed is a package and method to attach a heat spreader to a substrate. What is also needed is a package and method to attach a heat spreader to a substrate that reduces the number of assembly/process steps. What is also needed are a package and method to attach a heat spreader to a substrate that reduces the risk of delamination of the substrate surface. What is also needed is a package and method to attach a heat spreader to a substrate that does not require the use of clips.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

FIG. 6 is a cross-sectional view of a package with barbed connectors securing a heat spreader in accordance with some embodiments of the present invention;

FIG. 7 is a cross-sectional view of a package with barbed connectors securing a heat spreader in accordance with some embodiments of the present invention;

DETAILED DESCRIPTION

The following description and the drawings illustrate specific embodiments of the invention sufficiently to enable those skilled in the art to practice them. Some embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Embodiments or the invention provide an improved package and method to attach a heat spreader to a substrate. In some embodiments, an integrated circuit package and method to attach a heat spreader to a substrate may reduce the number of assembly/process steps. In some embodiments, a package and method to attach a heat spreader to a substrate may reduce the risk of delamination of the substrate surface. Embodiments of the invention provide a package and method to attach a heat spreader to a substrate that may eliminate the use of clips.

Figure 1:
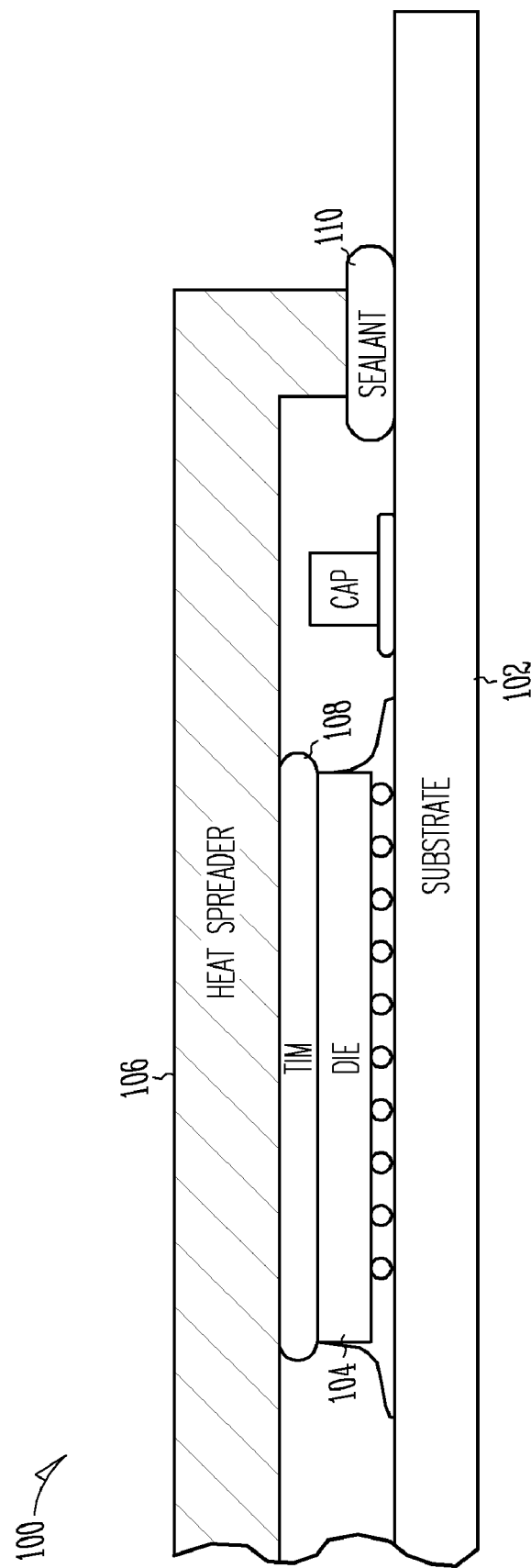
FIG. 1 is a cross-sectional view of a portion of a conventional package.

FIG. 1 is a cross-sectional view of a conventional package. Conventional package 100 includes substrate 102, die 104 mounted on substrate 102, and heat spreader 106. Heat spreader 106 may be thermally coupled with die 104 with thermal interface material (TIM) 108. Heat spreader 106 may be adhered to substrate 102 with sealant-adhesive 110. TIM 108 and sealant-adhesive 110 are generally cured at an elevated temperature. A clamping device, such as a clip or bridge clip, may be used to secure heat spreader 106 on package 100 in a carrier (not illustrated) during curing. The clip helps prevent movement of the heat spreader which may result from expansion of TIM 108 during curing, as well as movement resulting from other factors.

One problem with conventional package 100 and associated package-assembly techniques is that sealant-adhesive 110 may require additional curing steps beyond the curing of TIM 108. Another problem with this package configuration and package-assembly technique is that sealant-adhesive 110 sometimes delaminates the surface of substrate 102, especially in highly stressed packages. Another problem with this package configuration and package-assembly technique is that the insertion and removal of clips requires additional handling and assembly steps. Another problem with this package configuration and package-assembly technique is that the clips may change their spring/retention force over time and temperature. Another problem is that the position of the heat spreader may vary.

Figure 2:
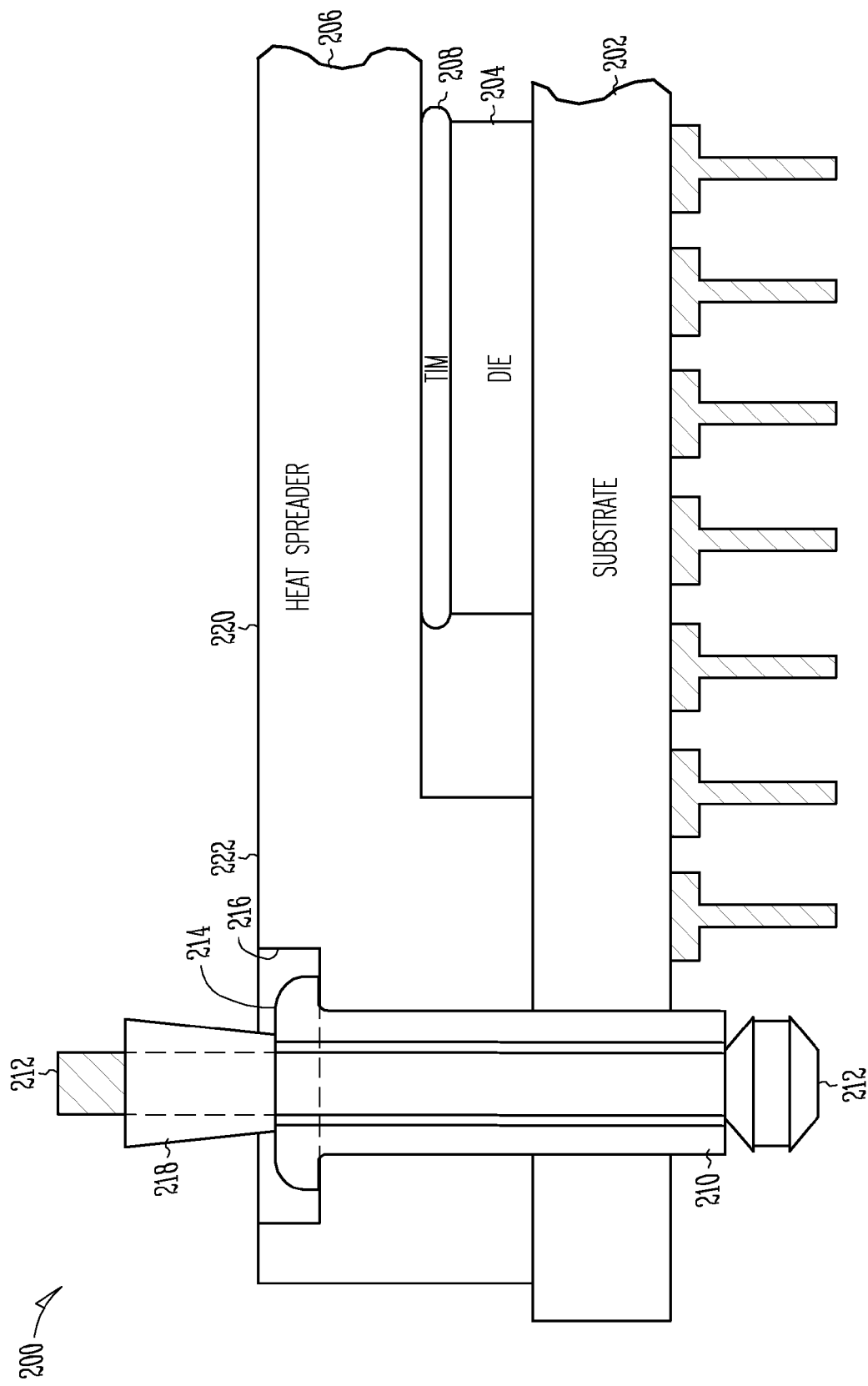
FIG. 2 is a cross-sectional view of a portion of a package with rivets securing a heat spreader in accordance with some embodiments of the present invention.

FIG. 2 is a cross-sectional view of a portion of a package with rivets securing a heat spreader in accordance with some embodiments of the present invention. Package 200 includes substrate 202, die 204 mounted on substrate 202, and heat spreader 206 thermally coupled to die 204 by TIM 208. TIM 208 may be solder or a polymer material. In accordance with the illustrated embodiments, a plurality of fasteners 210 couple heat spreader 206 to substrate 202. Although fasteners 210 are illustrated as rivets, many other types of fasteners may be used. Examples of suitable fasteners may include rivets, external gripping clips, barbed fasteners, threaded fasteners and non-threaded fasteners. Examples of suitable rivets may include, for example, push broach or pull broach rivets, solid rivets, tubular rivets, compression rivets, bifurcated rivets and metal piercing rivets. Examples of suitable non-threaded fasteners may include, for example, keys, splines, serrations, press-fit pins and retaining rings. In some embodiments, fasteners 210 may be referred to as microfasteners. Fasteners may be comprised of many suitable materials including metals and plastics. Examples of some suitable materials may include nickel alloys, aluminum alloys, brass alloys, carbon and alloy steels, copper alloys, nylon, stainless steel, bronze, and titanium.

When fasteners 210 comprise rivets, mandrill 212 is pulled through the rivet during assembly to expand the end of the rivet below substrate 202. Mandrill 212 and rivet tool portion 218 are removed leaving the rivet. In some embodiments, head 214 of the rivet may be located in recess 216 of heat spreader 206 so that the surface of the heat spreader opposite the die is planar allowing, for example, a heat sink to be attached thereto.

In some embodiments in which fasteners 210 comprise rivets, the rivets may be almost any commercially available rivet. The rivets may comprise a pull broach type of rivet. In some embodiments, the rivets may have a diameter ranging from 40 thousandths of an inch to 80 thousandths of an inch; however the dimensions of rivets may depend on various factors including the size the elements of package 200. Suitable rivets may be purchased, for example, from Textron, Inc.

Fasteners 210 may be placed around a perimeter of heat spreader 206, and in some embodiments, are placed at least at the corners of heat spreader 206. When viewed from above, heat spreader 206 may be rectangular and at least four fasteners at the corners may be used. In the specific embodiments illustrated in FIG. 2, fasteners 210 may extend completely through substrate 202.

Heat spreader 206 has central region 220 and perimeter region 222. Perimeter region 222 may have a thickness greater than central region 220 by approximately a height of the die and a thickness of the thermal interface material. The thinner central region and thicker perimeter region allow heat spreader 206 to contact substrate 202 in the perimeter region while leaving space for die 204 and TIM 208 in the central region. In this embodiment, the fasteners are received through holes in the perimeter region and may extend through aligned holes in substrate 202.

An assembly process for package 200 may include drilling holes for fasteners 210 in substrate 202 and heat spreader 206, although substrate 202 and/or heat spreader 206 may be provided with pre-drilled or pre-fabricated holes. Die 204 may be mounted on substrate 202 either before or after the holes are made in substrate 202. The assembly process may also include dispensing TIM 208, including any flux, onto die 204, and placing heat spreader 206 over the die aligning the fastener holes. Fasteners 210 may be inserted through the holes and, in the case of rivets, "riveting" substrate 202 to heat spreader 206. TIM 208 may be cured or re-flowed, as appropriate, for example, at an elevated temperature. In some embodiments, the holes for the fasteners may be fabricated or formed through laser ablation, stamping or punching, or by waterjet.

Package 200 may eliminate sealant-adhesive 110 (FIG. 1) used in conventional packages, along with process steps required to cure the sealant-adhesive. In addition, clips conventionally used during curing may also be eliminated to significantly reduce the number of package assembly steps. Furthermore, yield may be improved by the elimination of "sealant stringers" and heat spreader placement variations. The use of fasteners 210 may also provide a more rigid package which may improve reliability because tensile stress from the TIM may be reduced. Package 200 may also reduce heat spreader tilt.

In some embodiments, package 200 may be part of a system comprising package 200 mounted on a circuit board. The circuit board may be comprised of an organic or inorganic material. The circuit board may be a laminate and example organic materials for the circuit board may include BT, FR4, or FR5 for the core material. Examples of suitable inorganic materials for the circuit board include ceramics. In some embodiments, package 200 may be attached to the circuit board with solder balls, with a PGA socket, with a LGA socket, as well as with other techniques. Die 204 may comprise almost any semiconductor die including, for example, digital signal processors (DSPs), microprocessors, analog integrated circuits, chipsets and memory devices.

Figure 3:
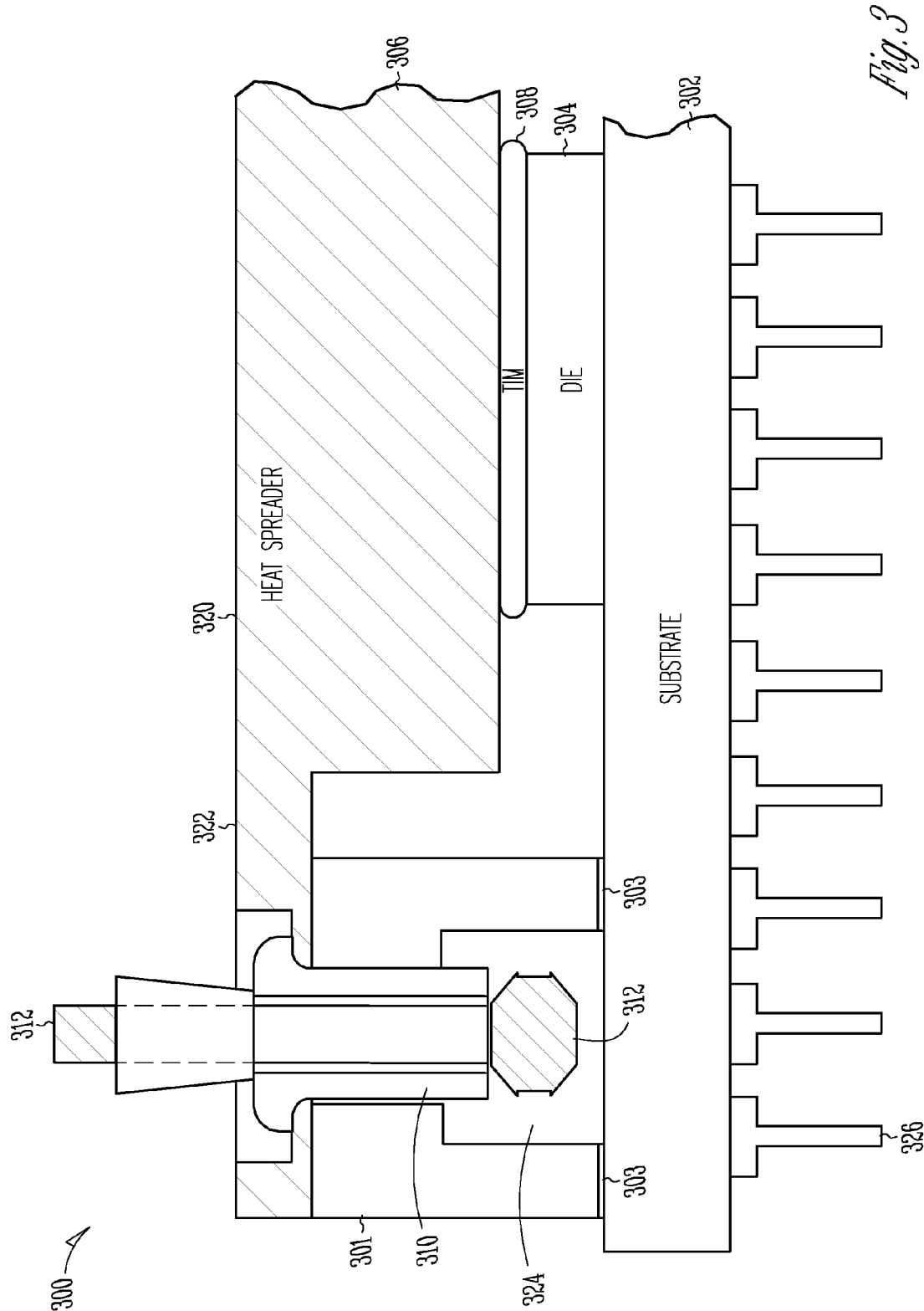
FIG. 3 is a cross-sectional view of a portion of a package with rivets securing a heat spreader in accordance with some embodiments of the present invention.

FIG. 3 is a cross-sectional view of a portion of a package with rivets securing a heat spreader in accordance with some embodiments of the present invention. Package 300 may be similar to package 200 (FIG. 2), however package 300 may include standoffs 301 between heat spreader 306 and substrate 302. Standoffs 301 may be about at least as high as a height of die 304 and a thickness of TIM 308. In some embodiments, perimeter region 322 of heat spreader 306 may have a thickness less than a thickness of central region 320. Fasteners 310 may be received through holes in perimeter region 322 of heat spreader 306 which are aligned with holes in standoffs 301. In the embodiments illustrated in FIG. 3, fasteners 310 do not need to extend completely through substrate 302. In some embodiments, standoffs 301 may be adhered to the substrate with adhesive 303. In some embodiments, standoffs 301 may be fabricated as part of the substrate. Standoffs 301 may include either a counter-bored hole or cavity 324 between a surface of the substrate to receive or retain an end of fastener 310. Although package 300 is illustrated with fasteners 310 comprising rivets, fasteners 310 may comprise other types of fasteners, such as the other types of fasteners listed for fasteners 210 (FIG. 2).

The assembly process for package 300 may be similar to the assembly process for package 200 (FIG. 2), however it may include receiving the substrate with standoffs 301 included. Alternatively, the assembly process may include adhering standoffs 301 to the substrate 302. One advantage to package 300 is that because fasteners 310 do not extend through substrate 302, pins 326 may be provided in a region under fasteners 310.

Figure 4:
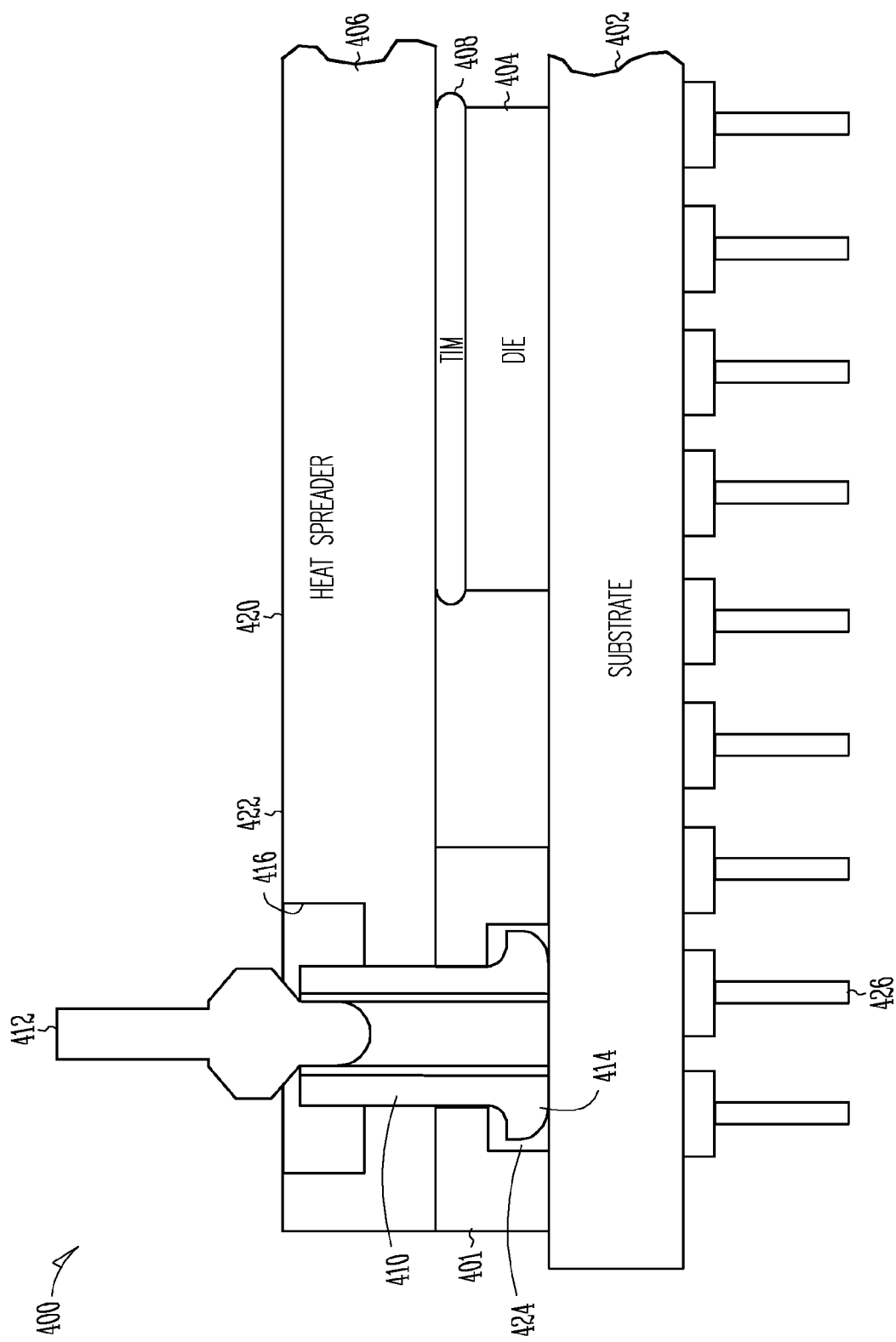
FIG. 4 is a cross-sectional view of a portion of a package with rivets securing a heat spreader in accordance with some embodiments of the present invention.

FIG. 4 is a cross-sectional view of a portion of a package with rivets securing a heat spreader in accordance with some embodiments of the present invention. Package 400 may be similar to package 300 (FIG. 3); however heat spreader 406 may have a more uniform thickness in perimeter region 422 and central region 420. Furthermore, standoffs 401 may have a height approximately equal to a height of die 404 and TIM 408. In this embodiment, fasteners 410 may be push-broach rivets having heads 414 located in counter-bored holes or recesses 424. During assembly, mandrill 412 may be pushed (rather than pulled) to expand a portion of fastener 410 in recess 416 of heat spreader 406. As part of the assembly process, fasteners 410 may be positioned prior to adhering standoffs 401 to substrate 402. One advantage to package 400 is that heat spreader 406 may be substantially flat which may help reduce costs. Another advantage to package 400 is that pins 426 (e.g., I/O pins or power/ground pins) may be provided in the region below rivets 410. Although package 400 is illustrated with fasteners 410 comprising rivets, fasteners 410 may comprise other types of fasteners, such as the other types of fasteners listed for fasteners 210 (FIG. 2).

Figure 5:
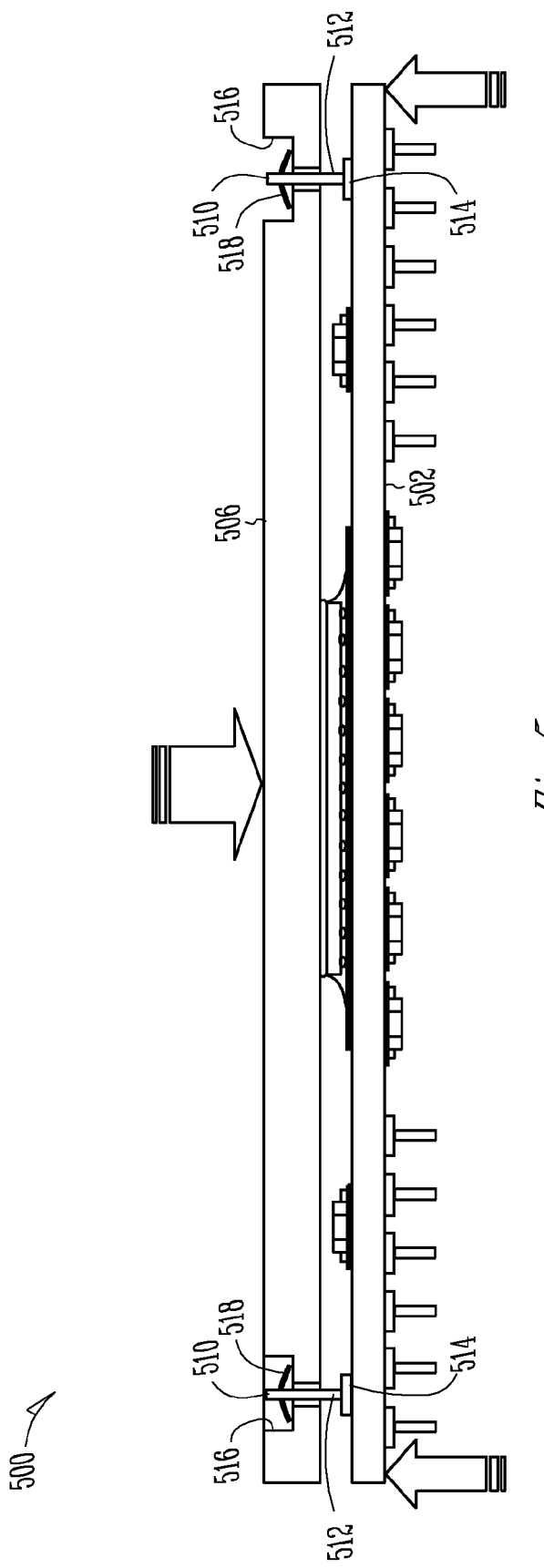
FIG. 5 is a cross-sectional view of a package with external-gripping clips securing a heat spreader in accordance with some embodiments of the present invention.

FIG. 5 is a cross-sectional view of a package with external-gripping clips securing a heat spreader in accordance with some embodiments of the present invention. Package 500 may be similar to package 400 (FIG. 4) in which heat spreader 506 is substantially planar on the die side. Package 500 includes fasteners 510 which comprise external-gripping clips or Timmerman nuts. Head portion 514 of fastener 510 may be adhered to a surface of substrate 502 with an adhesive or with solder. Pin portion 512 of fastener 510 may extend through a hole in heat spreader 506. Clip portion 518 may grip pin portion 512 to hold heat spreader 506 in position. Clip portion 518 may be comprised of materials such as plastic or sprung steel. Spacers (not illustrated for clarity) may be included between heat spreader 506 and substrate 502, and in some embodiments, may be similar to standoffs 401 (FIG. 4). The spacers may be washers provided around fasteners 510. Although package 500 is illustrated with fasteners 510 comprising external-gripping clips, fasteners 510 may comprise other types of fasteners, such as the other types of fasteners listed for fasteners 210 (FIG. 2). In addition, fasteners 510 may include threaded fasteners having their heads adhered to substrate 502, with a nut in place of clip portion 518. Heat spreader 506 may include recesses 516 allowing clip portion 518 and pin portion 512 to remain below the surface of the heat spreader.

In some embodiments (not illustrated), head portion 514 may be embedded within substrate 502. In some embodiments (not illustrated), fastener 510 may be inserted through a hole in substrate 502 from the pin side of substrate 502 and head portion 514 may remain below the substrate.

The assembly process for package 500 may include adhering head portion 512 of fasteners 510 to substrate 502, and placing heat spreader 506 over the die so that pin portions 512 protrude through corresponding aligned holes in the heat spreader. Clip portion 518 may be pressed over the pin portion 512 to hold heat spreader 506 in position.

FIG. 6 is a cross-sectional view of a package with barbed connectors securing a heat spreader in accordance with some embodiments of the present invention. Package 600 is similar to package 500 (FIG. 5); however fasteners 610 may comprise barbed connectors. Fasteners 610 may be embedded in the die side of heat spreader 606 into region 616. Region 616 may be a pre-drilled hole to receive a head of the fastener. Alternatively, fasteners may extend through the heat spreader from the side opposite the die side. In some embodiments, heads of fasteners 610 may be adhered to the die side of heat spreader 606.

Package 600 may also include receivers 612 to receive fasteners 610 and prevent fasteners 610 from being pulled out. Once the ends of fasteners 610 are inserted into receivers 612, barbs, for example, may prevent the fasteners from being removed. Receivers 612 may be self-gripping retaining rings or blind cages, and may be comprised of a metal insert which may be included within standoff 601. Standoffs 601 may include stiffeners as well as spacers. In some embodiments illustrated in FIG. 6B, receivers 612 may be located at the surface of substrate 602 and fastener 610 may protrude at least partially into the substrate. In some embodiments, illustrated in FIG. 6C, receivers 612 may be provided to prevent fastener 610 from protruding into the substrate. Receivers may, for example, be comprised of plastic, steel or sprung steel. Fasteners 610 may be a metal or a plastic. Although package 600 is illustrated with fasteners 610 comprising barbed connectors, fasteners 610 may comprise other types of fasteners, such as the other types of fasteners listed for fasteners 210 (FIG. 2).

For package 600, when a substantially flat heat spreader 606 is used, standoff 601 may be about as high as the height of the die plus the thickness of the thermal interface material; however other height standoffs 601 may also be used, depending on the heat spreader shape. For example, heat spreaders having thinner perimeter regions, such as heat spreader 306 (FIG. 3) may be used, allowing for taller or thicker standoffs. Heat spreaders having thicker perimeter regions may also be used, such as heat spreader 206 (FIG. 2), allowing for use of shorter or thinner standoffs, or even eliminating the spacers or standoffs.

The assembly process for package 600 may include snapping heat spreader 606 into position. Fasteners may be inserted into holes of standoffs 601 and may snap into receivers 612. The heat spreader may be provided with fasteners 610 already located in regions 616, or the fasteners may be inserted into regions 616. The thermal interface material between the die and heat spreader may be cured once the heat spreader is snapped into position. Advantages to package 600 and the associated assembly process are that no curing of sealant-adhesive is required to adhere the heat spreader to the surface. No clips are required, and the position of the heat spreader doesn't change with curing. Furthermore, snapping the heat spreader in position eliminates several assembly steps and processes which may help reduce costs.

FIG. 7 is a cross-sectional view of a package with barbed connectors securing a heat spreader in accordance with some embodiments of the present invention. Package 700 is similar to package 600 (FIG. 6) however fasteners 710 may be inserted through heat spreader 706 from the side opposite the die side. Fasteners may be received by receivers 716, which may be similar to receivers 616 (FIG. 6). Fasteners 710 may also protrude at least partially into substrate 702 depending on their length, and the thickness or height of standoff 701. Heat spreader 706 may be thicker in a perimeter region, such as heat spreader 206 (FIG. 2), reducing or eliminating the need for standoffs 701. Alternatively, standoffs 701 may be an integral part of substrate 702, or may be adhered to substrate 702.

The assembly process for package 700 may include placing heat spreader 706 in position over the die, and inserting fasteners 710 into aligned holes of the heat spreader and substrate until the fasteners are retained sufficiently in receivers 716. In some embodiments, the surface of heat spreader may be provided so that heads 714 of fasteners 710 remain at or below the surface opposite the die to allow coupling with a heat sink, for example.

Figure 8:
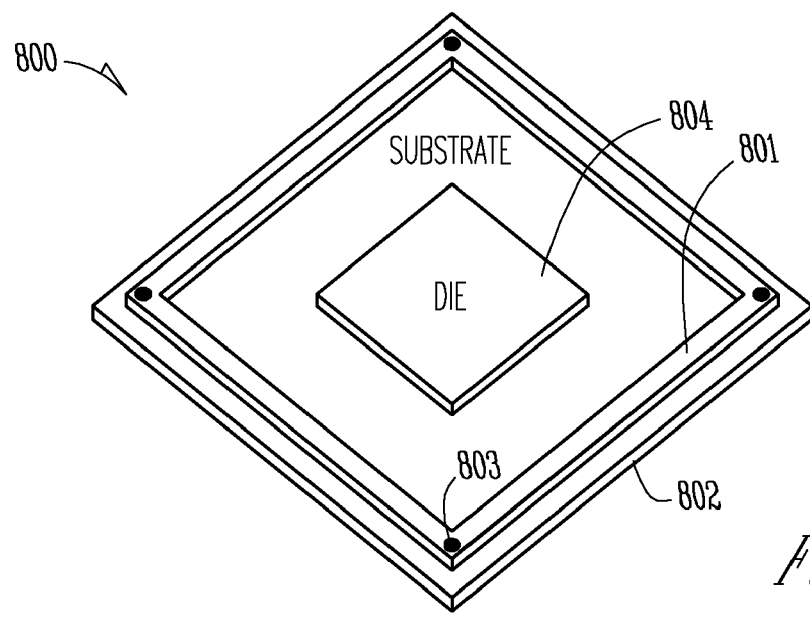
FIG. 8 is a perspective view of a portion of a package in accordance with some embodiments of the present invention.

FIG. 8 is a perspective view of a portion of a package in accordance with some embodiments of the present invention. Package portion 800 is illustrated without a heat spreader and includes die 804 mounted on substrate 802. Package portion 800 may be suitable for use with any of the previously discussed packages, although other package portions are also suitable. Package portion 800 includes one or more standoffs 801 which may have a height approximately equal to the height of die 804 plus a thickness of a thermal interface material used. In this embodiment, a heat spreader of more uniform thickness may be used in which the perimeter region has about the same thickness as the central region.

Although standoffs 801 are illustrated as a single element positioned around the perimeter of die 804, standoffs 801 may be comprised of separate elements, and may be part of substrate 802, or may be separate. Holes 803 for the fasteners may be provided at the corners of the standoff, however additional holes may be provided in other locations.

Figure 9:
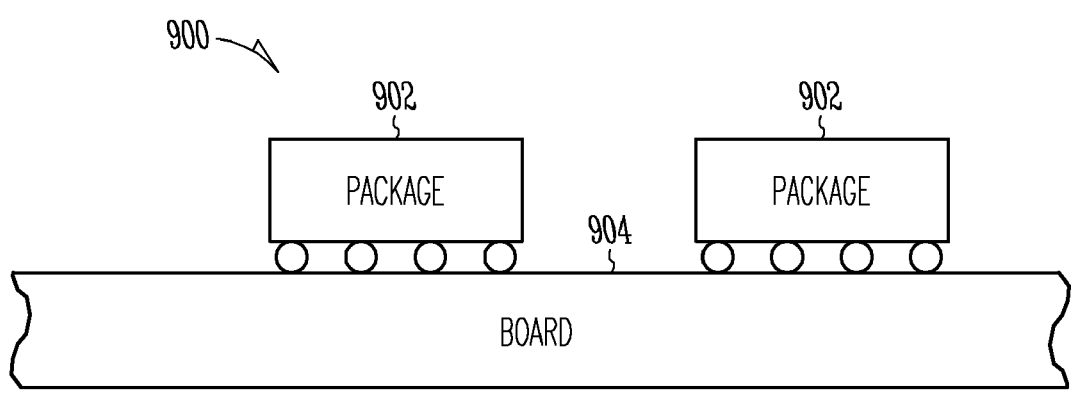
FIG. 9 is a system in accordance with some embodiments of the present invention.

FIG. 9 is a system in accordance with some embodiments of the present invention. System 900 includes package 902 mounted to circuit board 904. System 900 may be part almost any electronic device including a computing or processing system or wireless communication device. Package 902 may be one of the package embodiments discussed previously, including package 200 (FIG. 2), package 300 (FIG. 3), package 400 (FIG. 4), package 500 (FIG. 5), package 600 (FIG. 6A), or package 700 (FIG. 7). Circuit board 904 may be comprised of an organic or inorganic material, or may have a ceramic, organic or metallic core, and may have one or more of packages 902 coupled thereto and connected electrically.

Thus, improved packages and methods to attach a heat spreader to a substrate have been described. Also, packages and methods to attach a heat spreader to a substrate that reduces the number of assembly/process steps have been described. Also, packages and methods to attach a heat spreader to a substrate that reduces the risk of delamination of the substrate surface have been described. Also, packages and methods to attach a heat spreader to a substrate that does not require the use of clips have been described. In some embodiments, the heat spreader is provided over the die and is attached to the substrate with fasteners rather than a sealant-adhesive. Some examples of suitable fasteners may include rivets, barbed connectors, and gripping clips. The use of certain fasteners may allow the heat spreader to be snapped in position reducing assembly steps and improving positioning alignment. The use of fasteners may also help maintain the position of the heat spreader over the die during curing of the thermal interface material improving the reliability of the interface. Furthermore, the need for curing the sealant-adhesive is eliminated along with the use of clips to hold the heat spreader in position during curing.

It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. An integrated circuit package comprising:
a substrate that includes a top side and a bottom side;
a die mounted to the top side of the substrate;
a heat spreader thermally coupled to the die;
a standoff that includes an upper surface which engages the heat spreader and a lower surface that is adhered to the top side of the substrate, the standoff including an opening that extends into the standoff from the upper surface of the standoff and a cavity that extends into the standoff from the lower surface of the standoff, the cavity being wider than the opening in the standoff and aligned with the opening in the standoff; and
a fastener that secures the standoff to the heat spreader, the fastener including a first portion the extends through the opening in the standoff and a second portion that fits within the cavity in the standoff but is unable to fit within the opening in the standoff.

2. The package of claim 1 further comprising pins attached to a bottom side of the substrate.

3. The package of claim 1 wherein the fastener is a rivet.

4. The package of claim 3 wherein the second portion of the fastener is a head of the rivet.

5. The package of claim 1 further comprising a thermal interface material between the die and the heat spreader.

6. The package of claim 1 wherein the standoff is adhered to the top side of the substrate using an adhesive.

7. The package of claim 1 wherein the heat spreader includes a central region and a perimeter region such that the standoff engages the perimeter region of the heat spreader.

8. The package of claim 7 wherein the perimeter region of the heat spreader has a thickness that is less than a thickness of the central region.

9. The package of claim 8 wherein the fasteners extend through a hole in the perimeter region of the heat spreader.

10. The package of claim 1 wherein the cavity in the standoff is a counter-bored hole.

11. The package of claim 1 wherein the fastener is at least partially positioned within a recess in an upper side of the heat spreader such that the fastener is below the upper side of the heat spreader.

12. The package of claim 1 wherein the first portion of the fastener includes a barbed connector that is embedded in the heat spreader and the second portion of the fastener includes a gripping receiver.

13. The package of claim 12 wherein the gripping receiver is a retaining ring.

14. The package of claim 12 wherein the barbed connector extends at least partially into an opening in the substrate.

15. The package of claim 1 wherein the first portion of the fastener includes a barbed connector that extends through an opening in the heat spreader.

16. The package of claim 1 further comprising a plurality of fasteners that secure the standoff to the heat spreader, wherein the standoff includes a plurality of elements such that each element is secured to the heat spreader by one of the fasteners.

17. A system comprising:
a circuit board; and
an integrated circuit (IC) package mounted on the circuit board, the integrated circuit package including a substrate that includes a top side and a bottom side and a die that is mounted to the top side of the substrate, the integrated circuit package further including a heat spreader that is thermally coupled to the die and a standoff that includes an upper surface which engages the heat spreader and a lower surface that is adhered to the top side of the substrate, the standoff including an opening that extends into the standoff from the upper surface of the standoff and a cavity that extends into the standoff from the lower surface of the standoff, the cavity being wider than the opening in the standoff and aligned with the opening in the standoff, the integrated circuit package further including a fastener that secures the standoff to the heat spreader, the fastener including a first portion the extends through the opening in the standoff and a second portion that fits within the cavity in the standoff but is unable to fit within the opening in the standoff.

18. The system of claim 17 wherein the second portion of the fastener is a head of a rivet such that the head of the rivet is positioned within the cavity in the lower surface of the standoff.

19. The system of claim 17 further comprising a thermal interface material between the die and the heat spreader in the integrated circuit package.

20. The system of claim 17 wherein the integrated circuit package is connected to the circuit board by solder balls.

21. The system of claim 17 wherein the circuit board includes a socket and the integrated circuit package includes lead pins that extend from the bottom side of the substrate such that the lead pins are inserted into the socket.

22. The system of claim 17 wherein the standoff is adhered to the top side of the substrate using an adhesive.

23. The system of claim 17 wherein the heat spreader includes a central region and a perimeter region such that the standoff engages the perimeter region of the heat spreader, the perimeter region of the heat spreader having a thickness that is less than a thickness of the central region such that the fasteners extend through a hole in the perimeter region of the heat spreader.

24. The system of claim 17 wherein the cavity in the standoff is a counter-bored hole.

25. The package of claim 17 wherein the fastener is at least partially positioned within a recess in an upper side of the heat spreader such that the fastener is below the upper side of the heat spreader.

* * * * *